United States Patent
D'Souza et al.

(10) Patent No.: US 8,382,899 B2
(45) Date of Patent: Feb. 26, 2013

(54) METHOD AND MOULD FOR CASTING ARTICLES WITH A PRE-DETERMINED CRYSTALLINE ORIENTATION

(75) Inventors: Neil J D'Souza, Derby (GB); Philip A Jennings, Bristol (GB); Keerthi Devendra, Derby (GB)

(73) Assignee: Rolls-Royce PLC, London (GB)

( * ) Notice: Subject to any disclaimer, the term of this patent is extended or adjusted under 35 U.S.C. 154(b) by 1246 days.

(21) Appl. No.: 12/219,801

(22) Filed: Jul. 29, 2008

(65) Prior Publication Data
US 2008/0282972 A1    Nov. 20, 2008

Related U.S. Application Data

(62) Division of application No. 11/601,718, filed on Nov. 20, 2006, now Pat. No. 7,449,063.

(30) Foreign Application Priority Data

Dec. 1, 2005    (GB) .................................. 0524473.6

(51) Int. Cl.
*C30B 29/02*    (2006.01)
(52) U.S. Cl. ...................... 117/204; 117/200; 164/122.2
(58) Field of Classification Search .................. 117/200, 117/204; 164/122.2
See application file for complete search history.

(56) References Cited

U.S. PATENT DOCUMENTS

| 4,412,577 A | 11/1983 | Salkeld |
| 4,580,613 A | 4/1986 | Miller |

FOREIGN PATENT DOCUMENTS

| EP | 1577496 A2 | 9/2005 |
| JP | 2002293685 A | 10/2002 |

*Primary Examiner* — Bob M Kunemund
(74) *Attorney, Agent, or Firm* — Jeffrey S. Melcher; Manelli Selter PLLC

(57) ABSTRACT

Previously a number of techniques have been used in order to form single crystal or pre-determined crystallography components and articles. Each one of these techniques has its own particular problems, including susceptibility to error. By utilization of a bi-crystal experiment to determine melt-back length LM and by consideration of the ingress distance d from potential initiation nucleation points on a perimeter of a seed crystal, it is possible to determine a maximum ingress length d. By ensuring that the maximum ingress length d is less than or equal to a seed crystal diameter R, it is possible to project locus from potential nucleation points $C_1$, $C_2$ in terms of potential radii for stray grain propagation. As the seed crystal will have a known crystalline orientation, it will be possible to consider two divergent growth curves of the crystal in terms of the stray grains propagating from the point $C_1$, $C_2$. In such circumstances, a connector channel can be provided with a radius r=R/4 in an area between the periphery of the seed and the locus of the stray grain maximum ingress distances d. In situations where it is found d exceeds the crystal radius R, it will be understood that the actual crystal diameter R used may be increased or adjustment made with regard to the melt-back length LM in order to alter the maximum ingress distance d.

4 Claims, 4 Drawing Sheets

Figure 1:
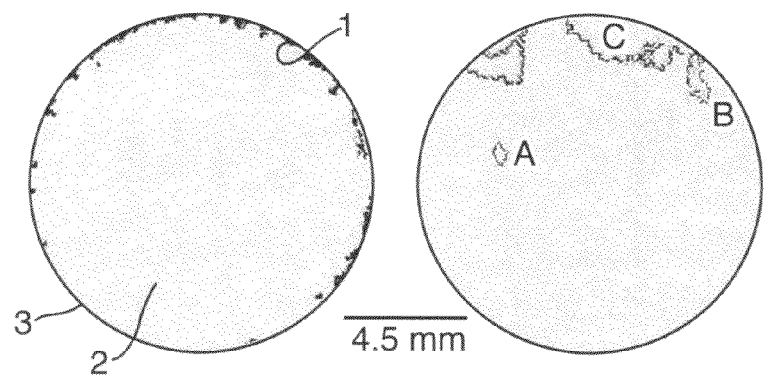

METHOD AND MOULD FOR CASTING ARTICLES WITH A PRE-DETERMINED CRYSTALLINE ORIENTATION

This is a Divisional Application of National application Ser. No. 11/601,718 filed Nov. 20, 2006, issued as U.S. Pat. No. 7,449,063, on 11 Nov. 2008. This application claims foreign priority to United Kingdom patent application No. 0524473.6, filed 1 Dec. 2005.

Certain aspects of the present invention relate to methods and moulds for forming pre-determined crystallography in an article or component.

It will be understood certain articles and components such as aerofoil blades for gas turbine engines are preferably formed with known crystallography in order to achieve desired operational performance. Thus, the components may be more resistant to high temperature creep or distortion. A number of methods have been identified for forming single crystal components and these generally utilise a seed crystal to initiate crystal forming in the component within a mould. What is generally required is a mechanism to ensure that the desired crystallography is achieved.

Each of these methods has disadvantages in attempting to successfully circumvent hazards with respect to stray grain nucleation in growth. For example: There is a change in the flux mode from chilled conduction to furnace radiation during initial withdrawal as a component is formed of up to 3 mm as the seed exits the hot zone of the melt of the molten material cast in order to form the component. This change in heat flux invariably leads to a thermal transient and it has been shown that initial withdrawal rates differing by a factor of 10 produced no appreciable difference in local heat transfer characteristics except where melt back is near to the base of the seed such that upon initial withdrawal there is a significant transient associated with the radial heat flux as the melt back exits the hot zone and melt back remote from the seed base where initial solidification in the seed is controlled by conduction through the solid but rapidly increases when radiation commences from the solid seed surface, i.e. when sufficient length of seed exists from the hot zone before settling to a steady-state value again but with radiation now controlled. In such circumstances, given that there are different heat transfer modes, it is not possible to altogether suppress the transient and additionally this leads to a lack of consistency in the process requiring the use of a spiral selector to mitigate the risk of a stray grain escaping into a forming component in a mould body. It will also be understood that the material from which the component forms can itself cause complications. Thus, with respect to nickel tungsten alloys where a visual inspection of the seed crystal prior to casting requires a chemical action, use of hydrofluoric acid does not meet acceptable Health and Safety Regulations for industrial usage. Finally, it will also be understood that it may be necessary to deliberately produce crystallographic orientations which are at an angle to the normal axial orientations and in these circumstances there will exist a wide range of axial orientations of stray grains that can grow competitively with the biased off-axial seed crystal preferred orientation and subsequently lead to orientation non-conformance.

It will be understood that typically the crystallography of the material from which an article or component is formed will generally be pre-known. Thus, for a crystal which has a face-centred cubic (fcc) structure there are three orthogonal growth directions (001, 010, 100) and there is four-fold symmetry. In such circumstances, there are a limited number of growth directions. In such circumstances, crystal growth in terms of dendritic growth during solidification will converge upon a wall of a mould or diverge from that wall in respective converging and diverging dispositions depending on axial orientation of seed. It is control of these misalignments of the crystallography which is necessary in order to create a suitable single crystal component or article.

In accordance with the present invention there is provided a method of forming an article having a desired pre-determined crystalline orientation comprising;
(a) determining a value for solidification length LS for a particular diameter R of a seed crystal when a maximum ingress distance d of axial grain growth into an off-axial single crystal matrix is given by the relationship d=R;
(b) adjusting heat transfer across the seed melt and choose a length for the seed to ensure maximum melt back length LM following mould soak and molten liquid pour is given by the relationship LM is less than LS;
(c) determining an optimum channel diameter r for a channel between the seed and a forming article in a mould body by the relationship r=R/4, and;
(d) positioning the channel in a region where a primary off-axial development matrix direction forms a converging disposition with a mould wall.

Typically, the solidification length LS is determined by a Bridgman bi-crystal experiment with the material from which the article is to be formed.

Generally, the region is obtained by considering the locus of two diverging curves at diametric extremities for ingress of axial grain growth relative to the seed.

Typically, the channel is provided by a wax rod or a ceramic rod coated with a wax or a ceramic seed insert between the seed crystal and mould body.

Also in accordance with the present invention there is provided a mould for forming an article having a desired pre-determined crystalline orientation comprising:
(a) a crystal seed presenter of known diameter R for a pre-determined seed length;
(b) a channel between the seed presenter and a mould body, the channel having a diameter r given by the relationship r=R/4; and,
(c) the channel positioned relative to a wall of the mould body in a region defined by the locus of two diverging ingress growth curves at diametric extremities for maximum grain ingress for a crystal seed in terms of its known diameter R.

Typically, the channel is formed by a wax rod or ceramic rod dipped with wax to blend the seed base and mould body or ceramic seed insert.

Other features of aspects of the present invention are defined in the claims and description below.

Embodiments of certain aspects of the present invention will now be described by way of example only with reference to the accompanying drawings in which:—

Figure 2A:
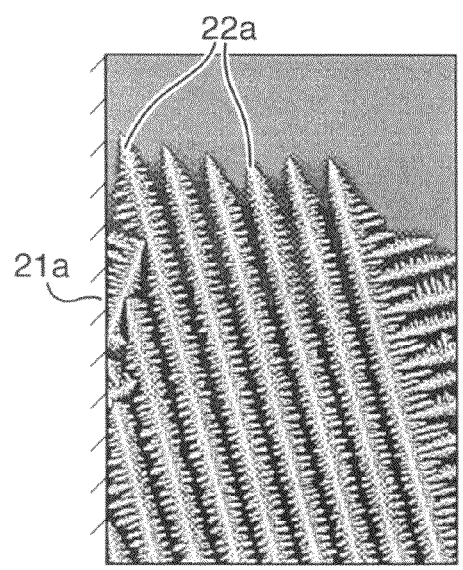
Figure 2B:
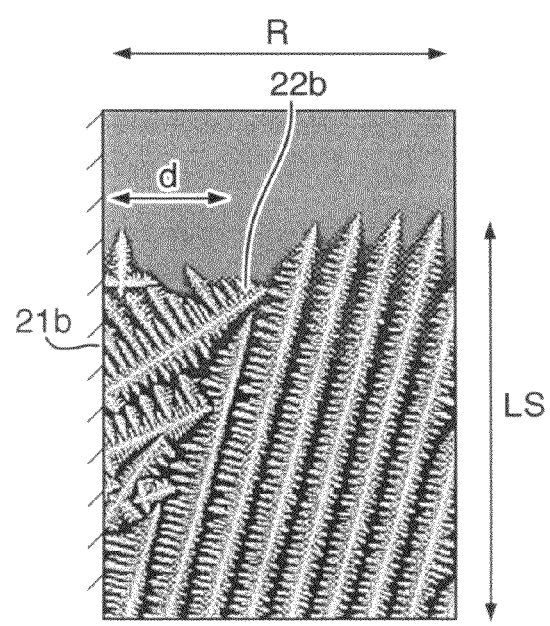
Figure 3:
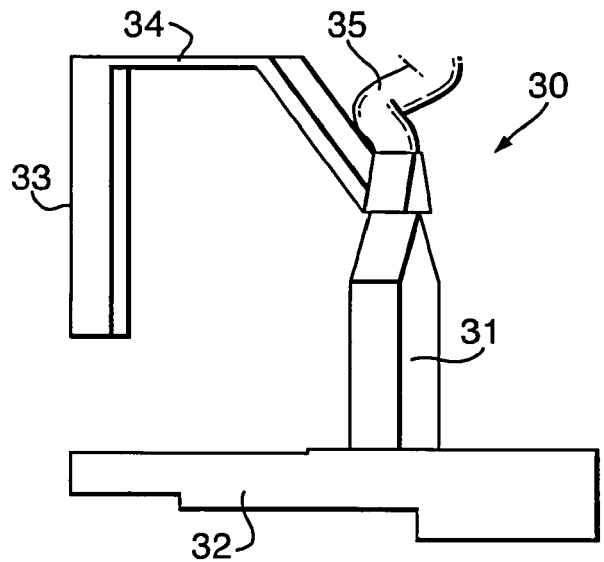
Figure 4:
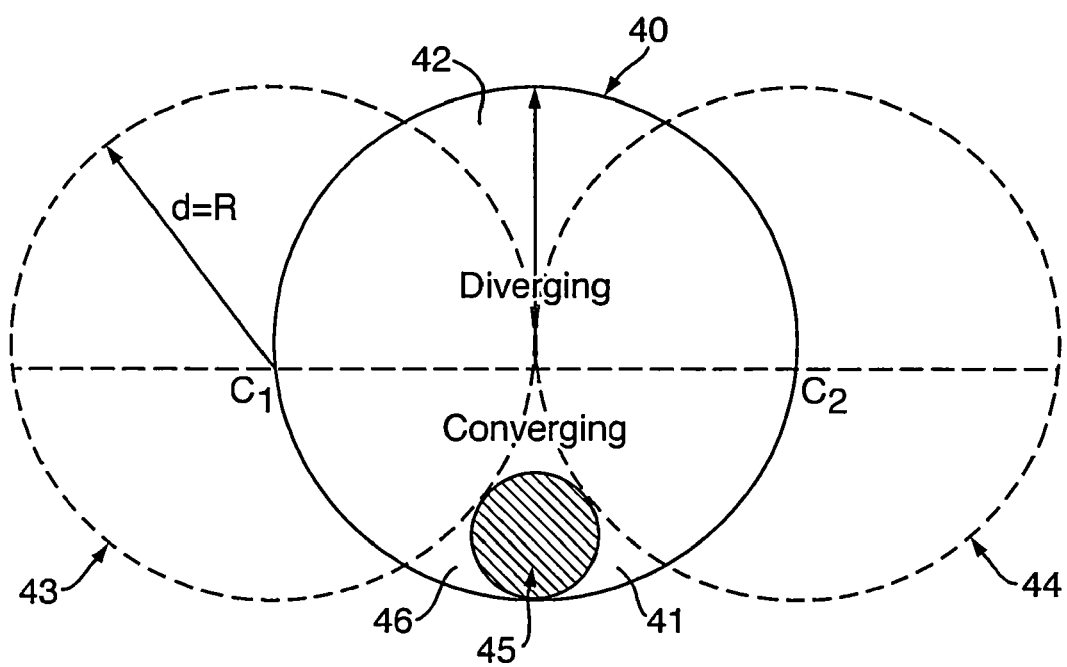
Figure 5:
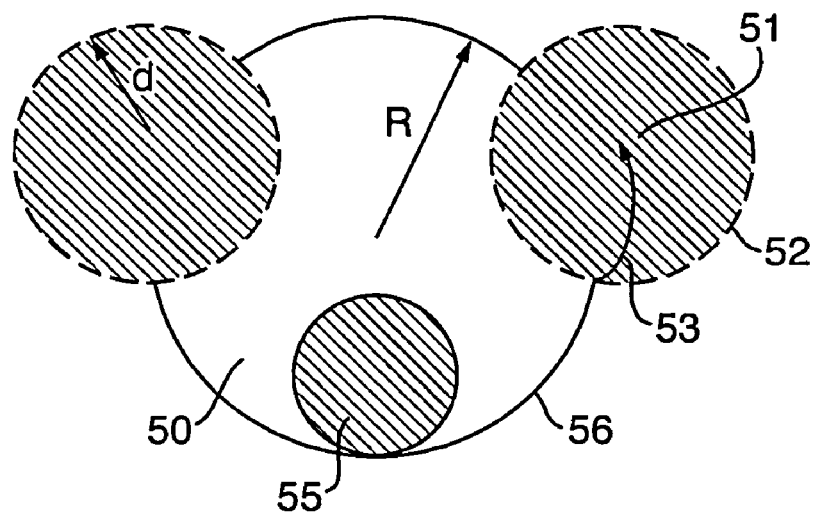
Figure 6:
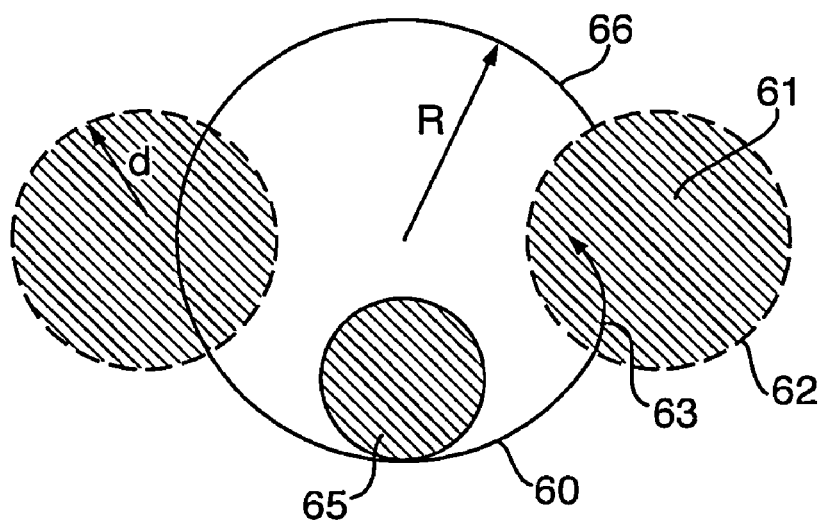
Figure 7:
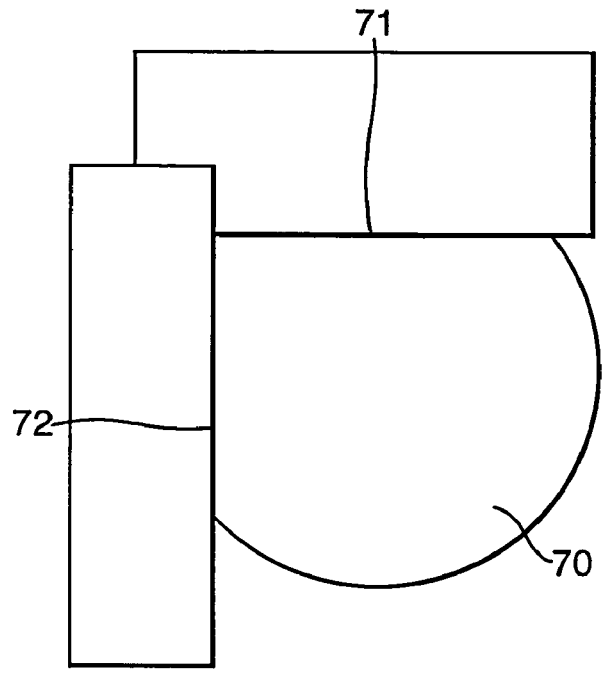
Figure 8:
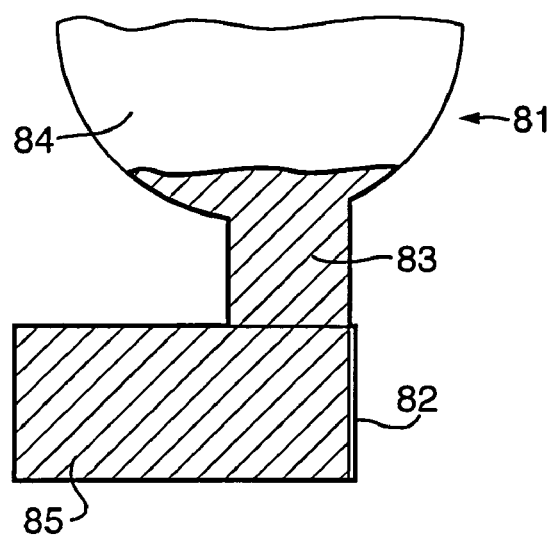

FIG. 1 provides photographic illustrations of solidification across a crystal seed;

FIG. 2 respectively illustrates in FIG. 2 (a) showing convergent dendritic crystal growth, and in FIG. 2(b) divergent dendritic crystal growth from a mould wall surface;

FIG. 3 schematically illustrates a crystal seed associated with a spiral channel to a mould body;

FIG. 4 provides a graphical illustration for determination of channel diameter in accordance with certain aspects of the present invention;

FIG. 5 provides a schematic illustration where grain growth is divergent and d<R;

FIG. 6 provides a graphic illustration where grain growth is divergent and d/<R<d; and, FIG. 7 provides a schematic illustration with regard to provision of a transverse growth (secondary) orientation to a component through a reference plane in a channel in accordance with one aspect of the present invention; and, FIG. 8 is a schematic cross-section of a mould.

As indicated above, the objective with regard to producing components with a pre-determined or desired crystallography is to ensure that initiation and propagation of stray grain growth is inhibited or limited. In accordance with certain aspects of the present invention a method is provided of forming and moulding components and articles which is independent of nucleation propensity for stray grains at and above a crystal seed melt-back level in comparison with prior methods. Furthermore, certain aspects of the present invention provide elimination of stray grain grown without the need for a spiral selector in accordance with some earlier methods. One aspect of the present invention utilises the kinetics of dendritic growth in relation to the orientation dependence of the off-axial columnar dendritic growth of a single crystal seed with respect to the seed parameter in terms of diverging and converging grain growth.

FIGS. 1 and 2 respectively illustrate photographically micro-structural cross-sections illustrating nucleation in FIG. 1 of stray grains and dendritic growth of stray grains in FIG. 2. As can be seen in FIG. 1 nucleation of stray grains 1 occurs more or less uniformly across a seed perimeter 3. It has been shown experimentally as solidification progresses only favourable orientations A B C survive. The nucleation of stray grains occurs when local solutal under-cooling exceeds the critical nucleation under-cooling and is associated with a transient at the mould walls, that is to say where the periphery 3 contacts those mould walls. Nucleation occurs at and behind primary dendritic tips driven by under-cooling considerations.

FIG. 2 illustrates nucleation of stray grains occurring when the local solutal under-cooling exceeds the critical nucleation under-cooling and, therefore, is associated with the transient at mould body walls 21a, 21b. Nucleation occurs at or behind the primary dendrite tips 22a, 22b driven by under-cooling considerations.

When considering the dendritic growth characteristics subsequent to nucleation it will be noted that the dendrites begin to grow into a constitutionally under-cooled liquid ahead of the tips 22. The growth characteristics of the single crystal dendrites are dependent on the inclination of the off-axial dendrites 22b in relation to the mould wall 21 (FIG. 2b). This is due to the effects and implications of under-cooling associated with the solute pile-up in the vicinity of the tips 22 and the volume of liquid available, that is to say at the converging/diverging grooves at the wall 21. In these circumstances there are two important considerations: (a) Growth of stray dendritic grains along the converging arc suppressed (180° semicircle), that is to say they remain equi-axed and do not grow into the interior of the forming liquid. (b) Growth at the divergent end, that is to say the dendritic end 22, is associated additionally with a columnar morphology and the extent to which the stray grains grow into the interior depends on the disposition of the seed primary growth direction or orientation in relation to the local liquidus isotherm curvature. In such circumstances, the morphology at the diverging (180° semicircle) can be equiaxed or columnar.

Aspects of the present invention utilise these considerations in order to provide a method and mould suitable for forming a desired crystallography article or component.

For a given primary orientation of single crystal and stray grain and corresponding to a local isotherm curvature of the liquidus; the extent to which the stray grain nucleated at the seed perimeter at/above the melt-back grows into a single crystal matrix across the cross-section is governed by:

The portion of the seed length fully molten measured from the melt-back upward to the base of a selector, and The ingress of the stray grain is restricted to where the primary <001> (growth direction) makes a diverging disposition with the mould wall.

FIG. 3 is a schematic diagram of a prior arrangement that shows that the essential constituents for a prior mould assembly 30 in the vicinity of a seed 31, a chill plate 32, a central sprue 33, a runner 34, and feeding liquid metal from the sprue 33 to above the seed 31 surface, i.e. below a connector helix 35. Heat transfer between various components of the assembly 30 is characterised by the appropriate heat transfer coefficients (HTC's). By analysis supplemented with carefully controlled experiments, these coefficients have been determined iteratively and subsequently validated to accurately reflect the casting process operation. The crucial parameter that was of primary influence was the shell-to-chill heat transfer coefficient which dictated the extent of melt-back during melt flow soak for a given (i) furnace operating temperature, (ii) seed geometry, (iii) seed position in the furnace and (iv) seed alloy composition, i.e. liquidus temperature and freezing temperature range. For a given seed alloy, through an appropriate choice of (i)-(iii), it is possible to produce any desired extent of melt-back following soak as well as after introduction of liquid metal onto the seed surface following pour. The parameters adjusted to produce a given extent of seed melt-back therefore for a given seed alloy and seed diameter are length of seed, and seed-to-chill heat transfer coefficient, e.g. raising the seed off the chill plate and the use of a base insulation.

In view of the above it will be appreciated that it is important to assess the competitive growth rates and extents between the desired single crystal structure and stray grain growth. For a given single crystal primary orientation, it is important to ascertain the maximum extent that a stray grain nucleated at the perimeter can grow into the single crystal matrix for a given solidification length. This can be determined through a simple bi-crystal experiment, where:

Crystal 1 has an axial orientation corresponding to the desired single crystal seed crystallography, and Crystal 2 has an axial <001> orientation to that crystallography.

The standard Bridgman solidification technique (bi-crystal experiment) can be used to directionally solidify the bi-crystals under conditions of planar liquidus isotherms, using high gradient directional solidification conditions (liquid metal cooling). Under these local processing conditions the maximum ingress distance d of a stray grain into the single crystal matrix for a given off-axial primary orientation of the seed can be obtained for a given solidification length LS (see FIG. 2b).

From the above it can be appreciated that there is an optimum location and optimum diameter for a cylindrical channel joining a seed crystal and a mould body in which a component or article is cast. These optimum locations and diameters apply for a given single crystal/stray grain orientation, local liquidus isotherms and a known seed crystal diameter R (FIG. 2b). In such circumstances, if we assume the melt-back length, LM corresponds to the solidification length LS and that two stray grains nucleate at the extremities of the diameter R, that is to say at point C1 and C2 in FIG. 4, it will be understood that there is separation in the diverging dispositions 41, 42 in order to define the maximum ingress distance possible into a seed crystal 40 having the diameter R. This maximum ingress distance is given by the relationship d=R and is shown with regard to the respective stray grain potential growth locus 43, 44 from points $C_1$ and $C_2$.

In the above circumstances it will be appreciated that there are two conditions possible, namely that the maximum growth distance d is less than or equal to the seed crystal diameter R or the maximum growth distance d is greater than the seed crystal diameter R.

In the first condition, where the growth distance d is less than or equal to the seed crystal diameter R, it will be understood when equality holds, the diameter r of the cylindrical channel connecting a base of a seed crystal holder to the base of a mould body within which a component or article is cast is given by a hashed region 45, as shown in FIG. 4, that is to say a converging primary growth direction of the single crystal 40, then in such circumstances there is equiaxed crystallographic morphology in respect of stray grains nucleating within the lower converging arc 41 and this is given by the relationship: $(R-r)^2+R^2=(R+r)^2$ which tends towards $r=R/4$.

In such circumstances, the diameter r of the channel 45 will tend to equate to one quarter that of the diameter R of the seed crystal 40. In such circumstances where the encroachment of growth distance d is less than the diameter R of the seed crystal 40, it will be understood that the optimum channel diameter r is still given by the relationship R/4. In the above circumstances, the optimum channel diameter r is R÷4 with respect to any other nucleation points along a seed perimeter 46 in the diverging portion 42 of the crystal seed 40 cross-section since if a nucleation point migrates along the circumference of the seed 40 in the diverging portion 42, this will necessarily result in a larger acceptable region for locating the channel 45 and retaining the validity of this approach. FIG. 5 illustrates the situation where R is greater than d. Thus, migration of a centre 51 of a stray grain growth circle 52 in the direction of arrow-head 53; it will be noted that such migration along the divergent portion of the seed perimeter 56 retains the validity of the present approach with respect to positioning and determination of the diameter of the channel 55.

If it is determined by the bi-crystal experiment that the encroachment or growth distance d will be greater than the putive crystal seed diameter R then there are two options. Firstly, the seed diameter R can be increased such that in such circumstances the increased seed diameter, R′ is greater than the encroachment distance d. Alternatively, by ensuring a smaller crystal melt-back length LM it will be understood that the extent of ingress or growth d′ can be arranged to be less than the putive crystal seed diameter R; d′, R, d. In either circumstance, by adjusting the seed diameter R or the melt-back length LM we return to a situation where the ingress or growth distance d is less than or equal to the seed diameter R is achieved.

By the above approach, the optimum diameter r for the cylindrical channel coupling a seed crystal with a mould body in which an article or component will be cast can be determined. Furthermore, as the seed crystal has a known crystallography and orientation it will be understood that a skew location of the cylindrical channel connecting the seed and mould body can be determined with respect to the crystal seed cross-section and, therefore, the channel presented within the convergent region of the seed crystal.

Aspects of the present invention relate to the growth of a specific off-axial oriented single crystal by a method including the steps as listed below. For a given diameter of seed crystal, R:

1. Determine the solidification length (LS) using the Bridgman bi-crystal experiment to ensure that the maximum ingress distance d of the axial <001> grain into the off-axial <001> single crystal matrix is given by the relationship, d=R.
2. Adjust the seed-chill HTC and choose seed length to ensure maximum melt-back LM following mould soak and pour of liquid is given by: LM<LS.
3. The optimum diameter r of cylindrical channel connecting seed base with base of blade is R/4.
4. The location of the channel corresponds to the region where the primary off-axial <001> single crystal forms a converging disposition with the mould wall and is obtained from the locus of divergent and growth curves, (FIG. 4).

It will be understood the cylindrical channel that joins the seed base with the base of the mould body for a component wax pattern can either be: (a) wax rod, (b) ceramic rod dipped with wax that blends with the seed base and the blade wax pattern at either end or (c) channel located within ceramic seed insert. Nevertheless, there are distinct advantages in the use of a ceramic seed insert, rather than a wax/ceramic rod. Namely, the location of the channel across the cross-section can be accurately and consistently maintained, as the channel is in-built within the insert itself, which corresponds to the seed dimensions. There is a far greater degree of subjectivity while locating a wax/ceramic rod consistently onto the seed surface. This problem being compounded for small diameter seeds. Furthermore, as shown at FIG. 7, when it is desired to transfer azimuthal (secondary) orientation to the component, a reference plane 7 is located on a seed 70 whose cross-section bears the shape of a truncated cylinder, unlike FIG. 4. The spatial location of the reference plane 7 can be transferred to a diverging portion of the cross-section. Additionally, to ensure that the seeds can be posted into a seed holder in the correct sense (if posted in the upside down position, the secondary orientation corresponds to ω′=[ω+180]°, a second orthogonal flat 72 is introduced. A ceramic insert can be manufactured to this configuration. Additionally, the wax join for the case of a wax/ceramic rod connection between seed surface and blade wax pattern is not robust and potentially can result in a twist between seed and component pattern during a shell coating operation and subsequently resulting in scatter in the secondary orientation. It may also be desirable to use an insitu injection technique in conjunction with a ceramic insert to minimise the alignment errors in the wax stage of a component manufacture operation and reduce the scatter in a secondary orientation.

Techniques with regard to use of seed holders are described in U.S. Pat. No. 4,580,613 and insitu injection techniques in European Patent No. 05251042. As indicated above, use of these techniques facilitates application of aspects of the present invention.

It will be understood from the above the present method does not attempt to counter creation of hazardous stray grains growing within a component by suppressing their nucleation at or above a crystal seed melt-back level. This avoids the difficulties of consistently suppressing the initial thermal transient associated with change in heat transfer modes during different parts of the method of forming an article or component, as described above. It will be understood that changes in front curvature during initial component cast withdrawal is very sensitive to local process parameters and therefore, creates local thermal gradients dependent upon location with regard to a mould body wall or initial seed crystal level.

Advantageously, the present invention allows once the parameters identified by the bi-crystal experiment have been determined, control of the method can be achieved simply through adjusting the crystal seed melt-back function for a given seed geometry and axial orientation. It will be understood that adjusting the melt-back length LM relative to the solidification length allows adjustment of the ingress length d as described above. Such an approach provides the advantage that seed melt-back is essentially governed primarily by mould body soak which can be maintained consistently since it is independent of initial withdrawal. Moreover, through a top-filled mould body assembly no discernable additional melt-back occurs subsequent to soak when liquid metal is poured into the mould body cavity. The mould body is firmly soaked during the initial introduction of molten material for casting the component or article.

It will be understood that the present method and mould does not require the use of a helix connected to overgrow stray grains that compete with the single crystal matrix desired. The present method of mould utilises location of a simple vertical cylindrical channel in a portion of the seed crystal cross-section where the stray grain morphology is equiaxed resulting in a lack of necessity for a spiral. Crystal formation is independent of nucleation potential of stray grains. It will be understood that there are advantages with regard to utilisation of the principle of orientation dependence on solutal under-cooling to govern competitive growth and in such circumstances use of an insitu method for casting is recommended (European Patent No. 05251042.7). The absence of a spiral connection has advantages, principally relating to a much narrower acceptance limit of crystallographic orientation by a more accurate alignment of a crystal seed with a wax pattern for a desired component or article by elimination of the helical grain selector. It will also be understood that there is simplified and faster wax assembly through an insitu method of wax injection to the seed crystal and component or article pattern. It will also be understood with helical grain selectors there is a potential for spiral of mould cracking leading to under-cooling and stray grain nucleation during component or article casting processes.

By provision of much narrower acceptance limits of crystallographic orientation, through more accurate alignment of a seed crystal with a wax pattern for a component or article as indicated there is elimination of the need for a helical grain selector. This has the added advantage that the use of an insitu casting method incorporating a seed holder can enhance the structural integrity of the mould body assembly which in turn minimises the relative twist between a seed holder and wax form to a component during a shelling process. A simpler and more robust structure will also eliminate some variability in the assembly of a crystal seed with a wax pattern.

As indicated above, components and articles in accordance with the present invention which may be formed include aerofoil blades for gas turbine engines where crystallography is important for final product performance criteria.

An important aspect of the invention is the location and diameter of the cylindrical channel joining the seed crystal top with the base of the wax pattern in a preferential domain on the seed surface. This can be circumvented if we choose a seed of sufficiently large diameter and position a narrow diameter channel at the centre of the seed. In this case, the stray grains are relegated to the periphery and the sufficiently large diameter would preclude the ingress of the stray grains nucleated at the perimeter from reaching the centre of the seed and subsequently grow into the channel. The essential disadvantages of this approach are:
1. The large seed diameter itself, which subsequently will limit the number of components on a carousel in a cluster assembly.
2. Also to keep the thermal mass of the seed constant it would be required to have a shorter seed, with the danger of completely melting the seed during the thermal soak operation. Retaining the longer seed to prevent complete melting would necessarily result in excess utilisation of seed alloy and so increased cost.

It will be appreciated that certain aspects of the present invention as outlined above require utilisation of a bi-crystal experiment and projection in order to determine solidification lengths, melt-back lengths for particular seed crystals in terms of their diameter and the material from which a pre-determined crystallography structure such as a component or article is to be formed. It will be understood that once these parameters LS, LM, R and d have been determined for a particular situation there will be a predictable degree of re-producability. It will also be understood that predictability will be further enhanced by incorporating assembly constraints such as described with regard to FIG. 7 where correct insertion of a seed crystal into a seed holder of a mould assembly is forced by the shape of that crystal and the reciprocal holder. In such circumstances a mould in accordance with certain aspects of the present invention will comprise a seed crystal holder, a cylindrical channel and a mould body within which a component or article will be cast. The connection cylinder as indicated above will be positioned relative to the seed crystal, as shown in FIG. 4 in hashed section 45 within the converging primary dendrite orientation arc of the seed crystal cross-section. As indicated above, this connector will be of a simple cylindrical shape and will not be spiralled or have a helix as described with previous mould assemblies. A connection will connect the seed crystal with a mould body within which a component is formed such that through appropriate melt-back length LM as well as choice of cylindrical connector radius r, single crystal orientation is achieved in the component or article formed. Thus, as shown schematically in FIG. 8, a mould assembly 81 has a seed crystal holder 82 with a cylindrical connection 83 extending between the holder 82 and a mould body 84. The seed holder 82 receives a seed crystal 85 and the connector 83 positioned in accordance with the methodology as described above such that the desired crystallography is provided when a molten liquid is poured into the body 84 to form a component or article. In such circumstances, the connection 83 provides a channel between the seed crystal 85 and the forming cast liquid in order to promote the desired crystallography.

In the above circumstances, a mould assembly or mould is provided which is of a simpler construction and, therefore, less susceptible to damage and alignment/tolerance errors.

Modifications and alterations of the present invention will be understood by those skilled in the art and, in particular, it will be understood that although the connector channel will generally be cylindrical it is possible that the seed crystal may be any appropriate shape and may, in particular, be shaped in order to ensure appropriate assembly into a seed holder within a mould assembly. Determination of melt-back length LM, solidification length LS, as well as ingress length d, can all be determined appropriately by measurement and, as indicated, in order to ensure that d is less than or equal to R (crystal seed diameter) alterations in the size of the seed or variation in the melt-back length may be provided.

Whilst endeavouring in the foregoing specification to draw attention to those features of the invention believed to be of particular importance it should be understood that the Applicants claim protection in respect of any patentable feature or combination of features hereinbefore referred to and/or shown in the drawings whether or not particular emphasis has been placed thereon.

We claim:
1. A mould for forming an article having a pre-determined crystalline orientation comprising:
   (a) a crystal seed presenter of known diameter R for a pre-determined seed length;

(b) a channel between the seed presenter and a mould body, the channel having a diameter r given by the relationship $r=R/4$; and,
(c) the channel positioned relative to a wall of the mould body in a region defined by locus of two diverging ingress growth curves and a diverging ingress growth curve for maximum grain ingress for a crystal seed in terms of its known diameter R.

2. A mould as claimed in claim 1 wherein the channel is formed by a wax rod or ceramic rod dipped with wax to blend the seed base and mould body or ceramic seed insert.

3. A mould as claimed in claim 1 wherein the channel is a straight cylindrical channel having a diameter r.

4. A mould as claimed in claim 1 wherein the crystal seed presenter incorporates reference features to ensure appropriate insertion of the seed crystal into the mould.

* * * * *